(12) United States Patent
Anselmo (10) Patent No.: US 9,431,802 B2
(45) Date of Patent: Aug. 30, 2016

(54) CABLE PROTECTOR

(71) Applicant: Salvatore Anselmo, Hamlin, NY (US)

(72) Inventor: Salvatore Anselmo, Hamlin, NY (US)

(73) Assignee: Solar Raceway, LLC, Rochester, NY (US)

( * ) Notice: Subject to any disclaimer, the term of this patent is extended or adjusted under 35 U.S.C. 154(b) by 0 days.

(21) Appl. No.: 14/827,275

(22) Filed: Aug. 15, 2015

(65) Prior Publication Data

US 2016/0049777 A1 Feb. 18, 2016

Related U.S. Application Data (60) Provisional application No. 62/070,140, filed on Aug. 15, 2014.

(51) Int. Cl.
| | |
|---|---|
| *F16L 3/12* | (2006.01) |
| *H02G 3/04* | (2006.01) |
| *F24J 2/00* | (2014.01) |
| *H01L 31/00* | (2006.01) |

(52) U.S. Cl.
CPC .............. *H02G 3/0437* (2013.01); *F24J 2/00* (2013.01); *H01L 31/00* (2013.01); *H02G 3/0462* (2013.01)

(58) Field of Classification Search
CPC .. H01L 31/00; H02G 3/0437; H02G 3/0462; H02G 3/04; F16L 3/10; F16L 3/26
USPC ............ 248/49, 67.5, 68.1, 74.1, 74.3, 74.4, 248/74.5, 62, 63, 58; 52/220.1, 220.3, 52/220.5
See application file for complete search history.

(56) References Cited

U.S. PATENT DOCUMENTS

| | | | |
|---|---|---|---|
| 2,023,433 A | 8/1933 | McConnell | |
| 5,887,831 A | 3/1999 | Post | |
| 6,448,497 B1 | 9/2002 | McCracken | |
| 8,356,778 B2* | 1/2013 | Birli | F16L 3/127 248/65 |
| 8,541,682 B2* | 9/2013 | Mazelle | H02G 3/32 174/68.1 |
| 2004/0026577 A1* | 2/2004 | Yasuda | B60R 16/0215 248/74.3 |
| 2008/0000669 A1* | 1/2008 | Galasso | H02G 3/0608 174/97 |
| 2008/0148535 A1* | 6/2008 | Santin | F16L 3/1203 24/470 |
| 2008/0203241 A1* | 8/2008 | Boudreau | F16L 3/02 248/58 |
| 2009/0084578 A1* | 4/2009 | Irisawa | B60R 16/0215 174/135 |
| 2010/0102175 A1* | 4/2010 | Dockery | F16L 3/1233 248/74.3 |

* cited by examiner

*Primary Examiner* — Gwendolyn Baxter
(74) *Attorney, Agent, or Firm* — Tracy Jong Law Firm; Tracy P. Jong; Cheng Ning Jong (57) ABSTRACT

A cable protector including a conduit having a top channel having at least one engaging edge and a bottom channel having at least one engaging edge adapted to be removably coupled to the engaging edge of the top channel. The pair of removably coupled engaging edges includes an outer portion having a profile including a projection extending from a step to a tip and an inner portion having a profile including a locking step. When urged against the inner portion, the outer portion is slidingly coupled to the inner portion until the step becomes locked in the locking step to form a cavity within the conduit to accommodate the cables. When pulled from the inner portion, the outer portion is slidingly decoupled from the inner portion after the step becomes dislodged from the locking step to provide access to cables disposed within the cavity.

13 Claims, 12 Drawing Sheets

CABLE PROTECTOR

PRIORITY CLAIM AND RELATED APPLICATIONS

This non-provisional application claims the benefit of priority from provisional application U.S. Ser. No. 62/070,140 filed on Aug. 15, 2014. Said application is incorporated by reference in its entirety.

BACKGROUND OF THE INVENTION

1. The Field of the Invention

The present invention relates to systems of protecting and managing cables in facilities using electronic equipment. More specifically, the present invention is directed to systems of protecting and managing bundles of cables in facilities using electronic equipment where the cables would be otherwise exposed to outdoor elements, e.g., in solar paneling applications.

2. Background Art

Facilities using large number of cables, e.g., electric or data, have a need to protect, and organize the cables. As the insulation materials for cables and cables are usually thin plastic, they can be attacked by certain chemicals and are exposed to potential physical damage. When cables must be located outdoors, such as on a roof, there are other hazards such as ultraviolet (UV) degradation from sunlight, animal and insect damage, wind scouring, lightning strikes, falling debris, stepping-on by service people working on rooftops. These cables need to be protected inside a conduit. It is an advantage if the same conduit that protects the cables can also help organize them for easier servicing. And finally, it is a further advantage if the conduit makes it easy to access the cables within for repairs.

One of the earliest cable tray systems is U.S. Pat. No. 2,023,433 to McConnell (hereinafter McConnell). While McConnell affords some protection of the cables, it is extremely inconvenient to access the cables on the bottom layers of the trough. All the top cable layers and the separating sheets must be removed to access the bottom layer of cables. The separating sheets could be lost or damaged, as could the lid itself. There is also no mention of how to accomplish a 90-degree bend if the trough is to go around a corner. There is the further problem that the enclosure is not waterproof as it relies on a screw penetrating the trough to secure it to a base.

U.S. Pat. No. 5,887,831 to Post (herein after Post) also attempts to address the need for organization with a complicated apparatus with defined spaces for each cable or wire. Unfortunately, a user of Post must hope that a particular wire will fit the defined slot and further hope that the number of slots is enough for the number of cables available. In order to secure each cable or wire, a multitude of different models of cable tray with the right slot size and number that would work are required. As such, Post discloses a cumbersome and expensive way to accomplish the goal. Furthermore, the design of the structure does not offer great support against crushing loads such as fallen ladders, footsteps etc. Finally, there is a plethora of screws required to assemble the apparatus. This is not the ideal assembly method for cold and snowy rooftops. Finally, there is no provision to provide weatherproofing for the many joints between sections. U.S. Pat. No. 6,448,497 to McCracken (hereinafter McCracken) improves on this design by having the individual cable channels extend sufficiently far so they serve to support the lid. Fitting uncooperative cables into defined channels is problematic and unrealistic. Similar to Post, the system of McCracken involves a "fiddly" job to restrain each cable and force it into its respective channel, and then clamp it down every few feet. And again, there is the matter of having to match the number of cables in an installation to the number provided in the apparatus. The requirement of numerous slots as in McCracken causes increased manufacturing and tooling costs. The use of too few renders McCracken's system unusable. Similar to Post, the system of McCracken is secured with screws with all the attendant disadvantages previously disclosed.

All of the prior art relies on tools to fasten, assemble and hold down the raceways or conduits. Tools and screws are an unwelcome necessity as they can and do damage the very cables that the raceway or trough it is designed to protect. None of the prior art provides a way to carry out these actions without or with minimal number of fasteners, e.g., screws.

SUMMARY OF THE INVENTION

In accordance with the present invention, there is provided a cable protector for enclosing cables, the cable protector including a conduit having:

(a) a top channel having at least one engaging edge; and (b) a bottom channel having at least one engaging edge adapted to be removably coupled to the engaging edge of the top channel, wherein the pair of removably coupled engaging edges includes an outer portion having a profile including a projection extending from a step to a tip having a cam surface and an inner portion having a profile including a locking step and a cam surface and the outer portion is configured such that when urged against the inner portion, the outer portion is slidingly coupled to the inner portion at their cam surfaces until the step becomes locked in the locking step to form a cavity within the conduit to accommodate the cables and when pulled from the inner portion, the outer portion is slidingly decoupled from the inner portion after the step becomes dislodged from the locking step to provide access to the cables disposed within the cavity.

In one embodiment, the present cable protector further includes a supporting base configured for removable attachment to the bottom channel to support the conduit.

In one embodiment, the bottom channel further includes a pair of engagement features adapted for removable engagement with a pair of engagement features of the supporting base.

In one embodiment at least one of the pair of engagement features of the bottom channel and the pair of engagement features of the supporting base includes a boss adapted to be removably engaged with a groove.

In one embodiment, the present cable protector further includes an adhesive adapted to a bottom face of the supporting base to secure the supporting base to a structure.

In one embodiment, the supporting base further includes at least one aperture configured to facilitate fastening of the supporting base to a structure.

In one embodiment, the outer surfaces of the removably coupled engaging edges are substantially featureless to lower wind drag.

In one embodiment, the bottom channel further includes at least one aperture for enabling access to the cavity.

In one embodiment, the cross-sectional profile of the conduit is circular.

In one embodiment, the present cable protector further includes a supporting base configured for removable attachment to an outer surface of the bottom channel, wherein the supporting base is configured to support the conduit.

In one embodiment, the bottom channel further includes at least one holder disposed substantially at the at least one engaging edge of the bottom channel. The at least one holder is adapted to removably receive one end of a strap configured to prevent intrusion of the cables outside of the opening defined by the bottom channel.

An object of the present invention is to provide a cable protector that can be used with minimal or no tools.

Another object of the present invention is to provide a cable protector that is easy to assemble.

Another object of the present invention is to provide a cable protector that organizes cables in a way that makes them easy to access.

Another object of the present invention is to provide a cable protector that protects against physical damage.

Another object of the present invention is to provide a cable protector that provides lowered wind resistance.

Another object of the present invention is to provide a cable protector that is corrosion resistant.

Another object of the present invention is to provide a cable protector that is economical to produce.

Another object of the present invention is to provide a cable protector that works with existing technology to provide an economical solution.

Whereas there may be many embodiments of the present invention, each embodiment may meet one or more of the foregoing recited objects in any combination. It is not intended that each embodiment will necessarily meet each objective. Thus, having broadly outlined the more important features of the present invention in order that the detailed description thereof may be better understood, and that the present contribution to the art may be better appreciated, there are, of course, additional features of the present invention that will be described herein and will form a part of the subject matter of this specification.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

PARTS LIST

2—bottom channel
3—conduit
4—top channel
6—supporting base
8—structure to which supporting base is attached
10—adhesive
12—sealing material
14—groove
16—extension
18—knockout
20—line indicating suitable location to drill
22—tee fitting
24—top portion of tee fitting
26—bottom portion of tee fitting
28—aperture
30—boss
32—grab hook
34—projection
36—cam surface of outer portion
38—step of projection
40—locking step
42—cable retainer strap holder
44—cam surface of inner portion
46—space
48—cable
50—bottom surface of bottom channel
52—aperture
54—grommet
56—height of supporting base
58—height of cable protector
60—cable retainer strap
62—elbow fitting
64—top portion of elbow fitting
66—bottom portion of elbow fitting Particular Advantages of the Invention The present cable protector or conduit protects cables and cables running in its interior, while allowing easy and convenient access to cables inside. In one embodiment, the present conduit can be extruded or constructed from sheet metal, is corrosion resistant and includes two portions and is openable to allow access into its interior space. The present cable protector can be installed with minimal tools or without tools or screws. The present cable protector is particularly suited for rooftop installations due to its aerodynamic shape and ability to be mounted with adhesives on rubber roof membranes that must not be breached.

DETAILED DESCRIPTION OF A PREFERRED EMBODIMENT

The term "about" is used herein to mean approximately, roughly, around, or in the region of. When the term "about" is used in conjunction with a numerical range, it modifies that range by extending the boundaries above and below the numerical values set forth. In general, the term "about" is used herein to modify a numerical value above and below the stated value by a variance of 20 percent up or down (higher or lower).

Figure 1:
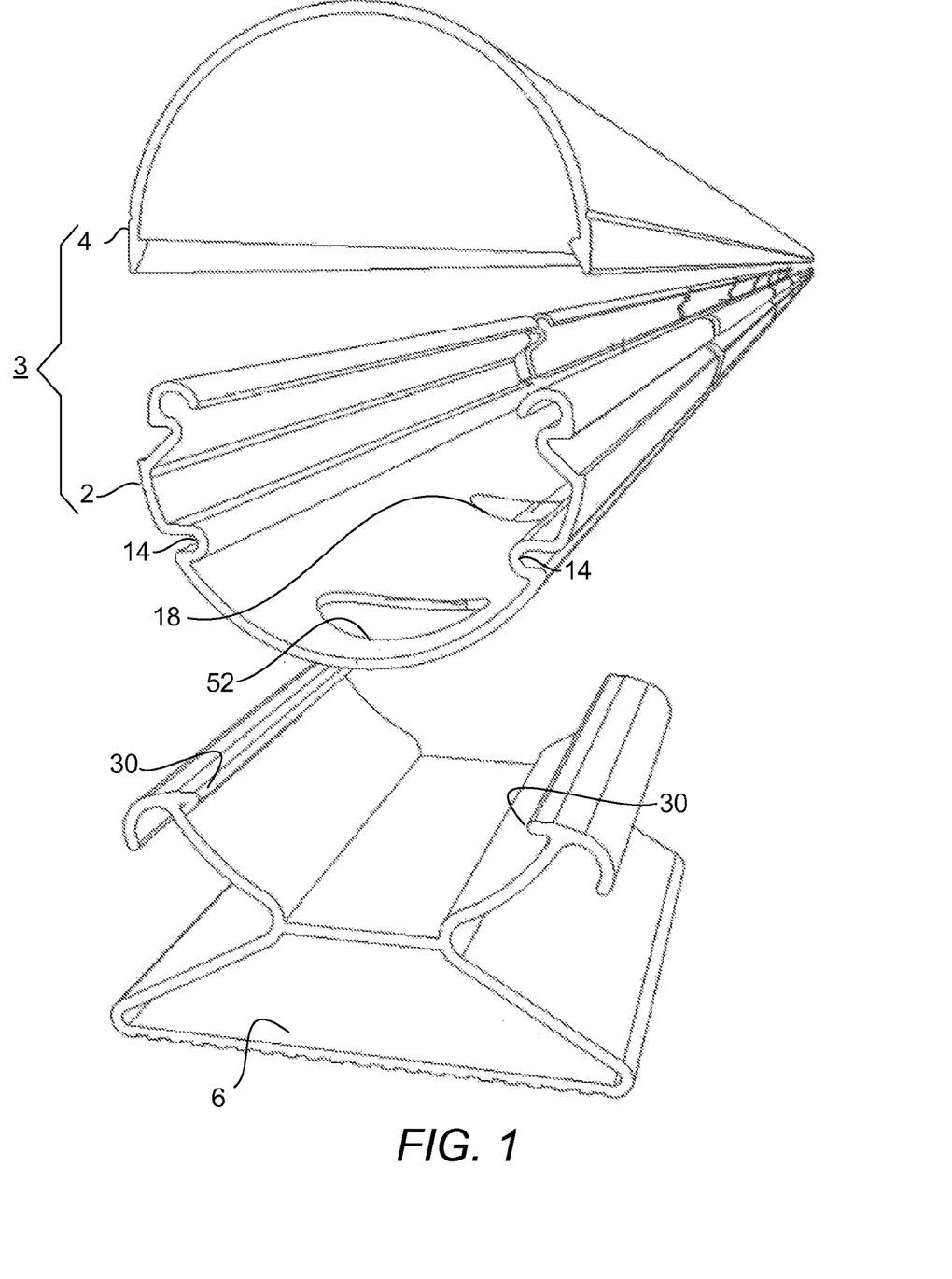
FIG. 1 is an exploded perspective view of a cable protector, in accordance with one embodiment of the present invention.
Figure 2:
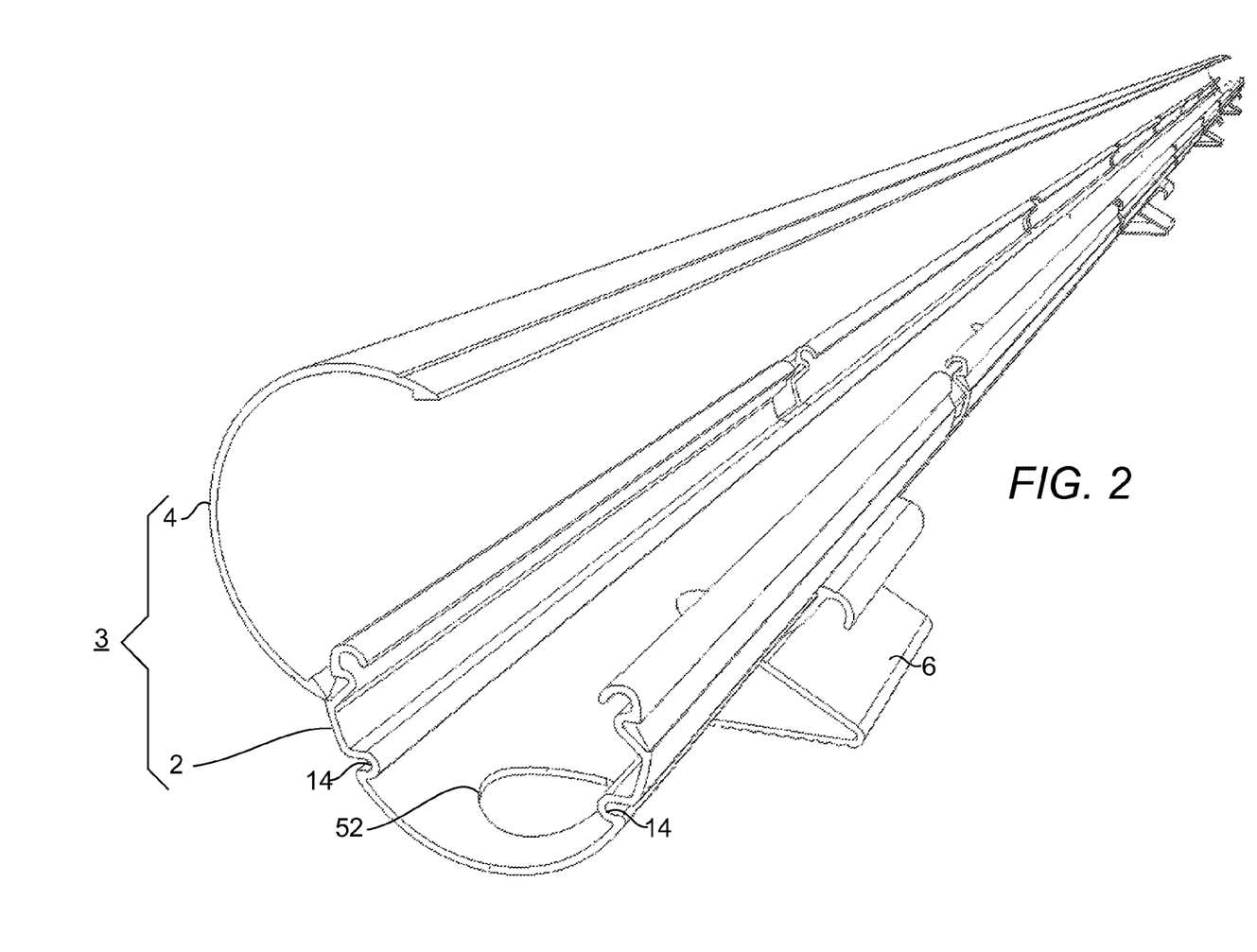
FIG. 2 is a perspective view of a cable protector in its semi-assembled state, in accordance with one embodiment of the present invention.

FIG. 1 is an exploded perspective view of a cable protector, in accordance with one embodiment of the present invention. FIG. 2 is a perspective view of a cable protector in its semi-assembled state, in accordance with one embodiment of the present invention. It can be seen that a present conduit 3 includes a bottom channel 2 and a top channel 4. When assembled, the top and bottom channels 4, 2 form a conduit 3 for containing cables.

In one embodiment, there is further provided a supporting base 6 configured for removable attachment to the bottom channel 2 to support the conduit 3. In one embodiment, the bottom channel 2 further includes a pair of engagement features adapted for removable engagement with a pair of engagement features of the supporting base 6. In one embodiment, at least one of the pair of engagement features of the bottom channel 2 and the pair of engagement features of the supporting base 6 includes a boss 30 adapted to be removably engaged with a groove 14. In the embodiment shown, a supporting base 6 configured for removable attachment to the bottom channel 2 can be used to support the conduit 3. Referring to FIG. 2, the bottom channel 2 is mounted on a supporting base 6. It shall be noted that the bottom surface 50 of bottom channel 2 is supported by extensions 16 of the supporting base 6. In the embodiment shown, the bottom surface 50 of the supporting base 6 includes two substantially parallel grooves 14, each opening outwardly from the bottom channel 2. As the grooves 14 are disposed substantially in parallel, upon insertion of the bosses 30, such bosses 30 may only be removed by first increasing the spread of the extensions 16. Grab hooks 32 provide grasp points for a user to initiate the spread of the extensions 16 for convenient removal of the conduit 3. If it is necessary to remove the bottom channel 2 to replace or relocate it, this is easily done by pulling apart the grab hooks 32 in opposite directions which causes the projecting bosses 30 to disengage from the grooves 14 and thus allowing the bottom channel 2 to be removed with no tools. Upon installation of a conduit 3 onto a supporting base 6, the conduit 3 becomes capable of slidable movement with respect to the supporting base 6 along the length of the conduit. Such movement accommodates thermal expansion and contraction in the conduit 3 and/or supporting base 6 and prevents buckling that may be caused in any of these parts.

Figure 3:
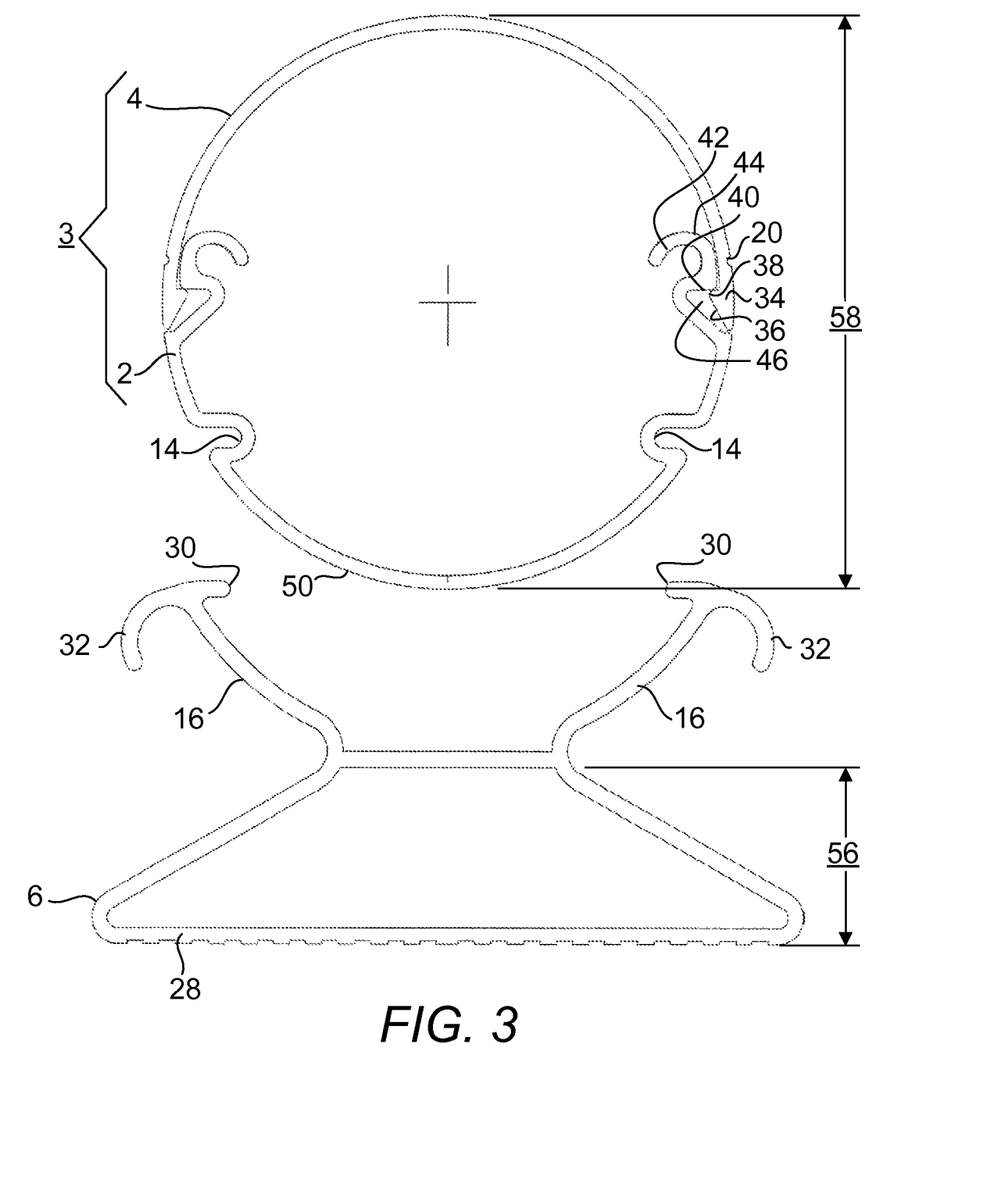
FIG. 3 is an end view of a cable protector, in accordance with one embodiment of the present invention, depicting an uninstalled conduit.
Figure 4:
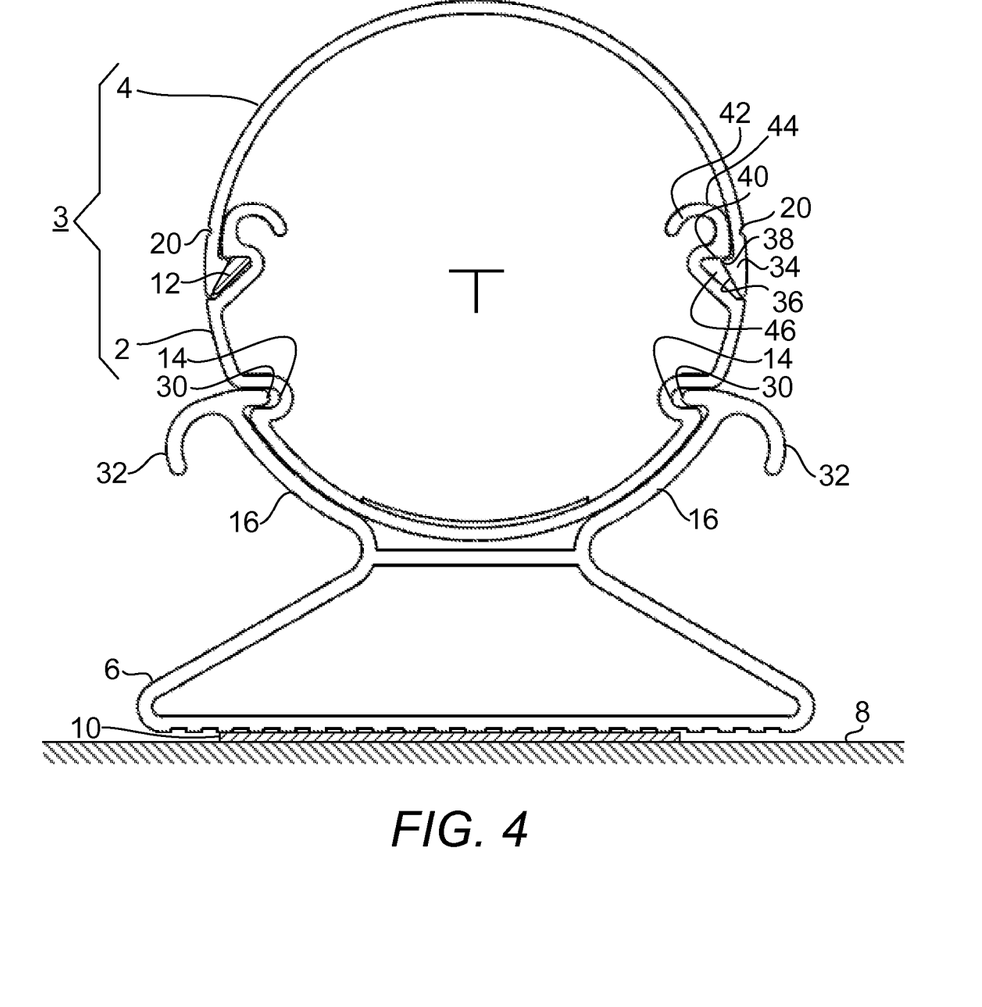
FIG. 4 is an end view of a cable protector, in accordance with one embodiment of the present invention, depicting an installed conduit.
Figure 5:
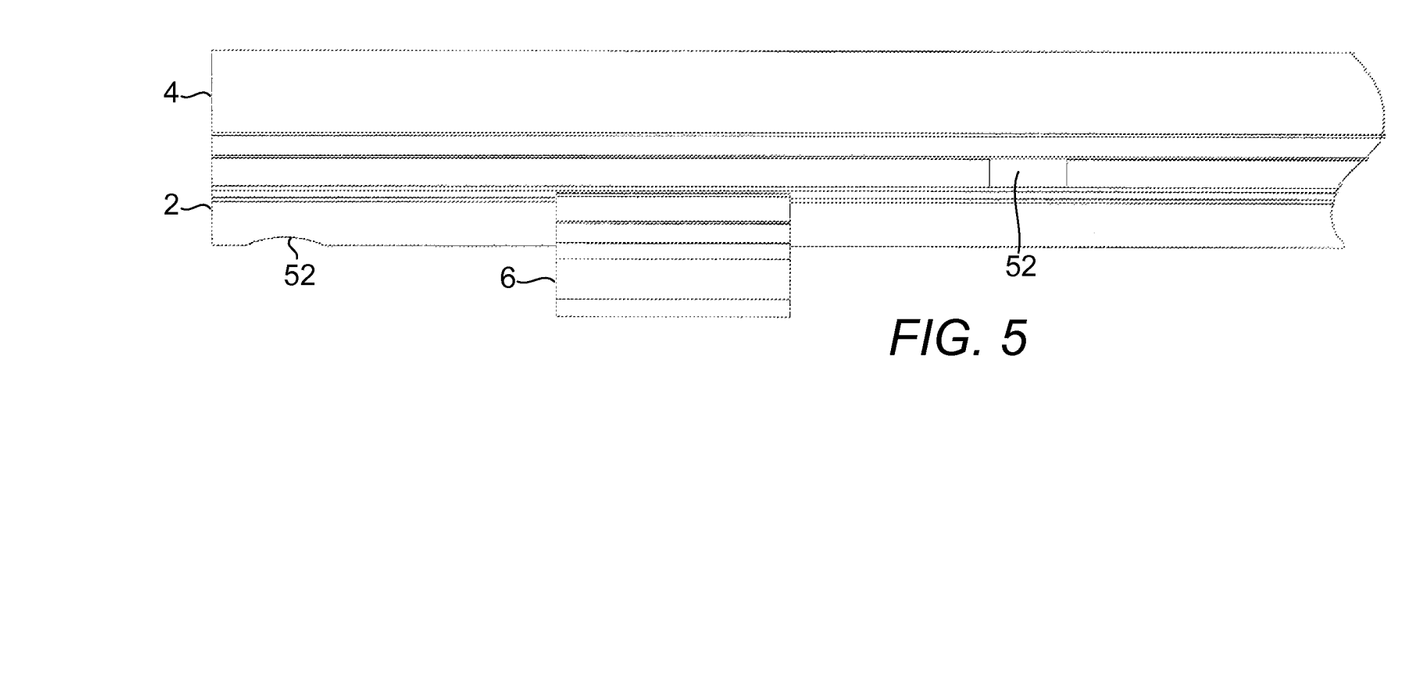
FIG. 5 is a partial side view of a cable protector in its semi-assembled state, in accordance with one embodiment of the present invention.

FIG. 3 is an end view of a cable protector, in accordance with one embodiment of the present invention, depicting an uninstalled conduit 3. FIG. 4 is an end view of a cable protector, in accordance with one embodiment of the present invention, depicting an installed conduit 3. FIG. 5 is a partial side view of a cable protector in its semi-assembled state, in accordance with one embodiment of the present invention. In the embodiment shown, the top channel 4 includes two engaging edges, each disposed on a longitudinal edge of the top channel 4. The bottom channel 2 includes two matching engaging edges, each adapted to be removably coupled to one engaging edge of the top channel 4. In the ensuing description, the engaging edges and grooves of a conduit are described as if they are viewed from one longitudinal end of the conduit although such edges and grooves extend the entire length of the conduit. Each pair of removably coupled engaging edges includes an outer portion and an inner portion. As shown, outer portions define the longitudinal edges of the top channel 4 and inner portions, on the other hand, define the longitudinal edges of the bottom channel 2. Outer portions may alternatively be disposed on the longitudinal edges of the bottom channel 2 instead provided that an engaging edge of the top channel 4 is coupled with a complementary engaging edge of the bottom channel 2. The profile of an outer portion includes a projection 34 which extends from a step 38 to a tip having a cam surface 36. The profile of an inner portion includes a locking step 40 and a cam surface 44. Such cam surfaces 36, 44 dictate the path coupled outer and inner portions will travel relative to one another, ensuring that step 38 will be properly led to or separated from locking step 40. In coupling a top channel 4 to a bottom channel 2, the top channel 4 is aligned such that their respective complementary engaging edges are roughly lined up. When the top channel 4 is urged against the bottom channel 2, the top channel 4 flexes outwardly while compressing the bottom channel 2, enabling the cam surfaces 36 of the outer portion to slide more readily against the cam surfaces 44 of the inner portion until the steps 38 becomes locked in their respective locking steps 40 to form a cavity within the conduit 3 to accommodate the cables. The outer surfaces of the engaging edges configured for removable coupling are substantially featureless to lower wind drag. The cross-sectional profile of the conduit is preferably circular although other profile shape may be possible provided that the profile shape does not cause significant wind resistance.

In removing a top channel 4 from a bottom channel 2 of a conduit and when access to a longitudinal end of the conduit is available, a user can simply grasp the top channel 4 and separate it from the bottom channel 2. When pulled from the inner portion, the outer portion is slidingly decoupled from the inner portion after the step 38 becomes dislodged from the locking step 40 to provide access to the cables disposed within the cavity. In circumstances where access to at least one longitudinal end is not possible, the tip of a flat-head screwdriver may be inserted in a seam made between a top channel 4 and a bottom channel 2 to aid in separating the two channels 4, 2. Referring to FIG. 4, the present cable protector further includes an adhesive 10 adapted to a bottom face of the supporting base 6 to secure the supporting base 6 to a structure 8, e.g., rooftop, etc. In one embodiment, there is further provided a sealing material 12, e.g., weather stripping material, configured to be disposed in a space 46 between the engaging edges configured for removable coupling to provide enhanced sealing between the top and bottom channels.

Figure 6:
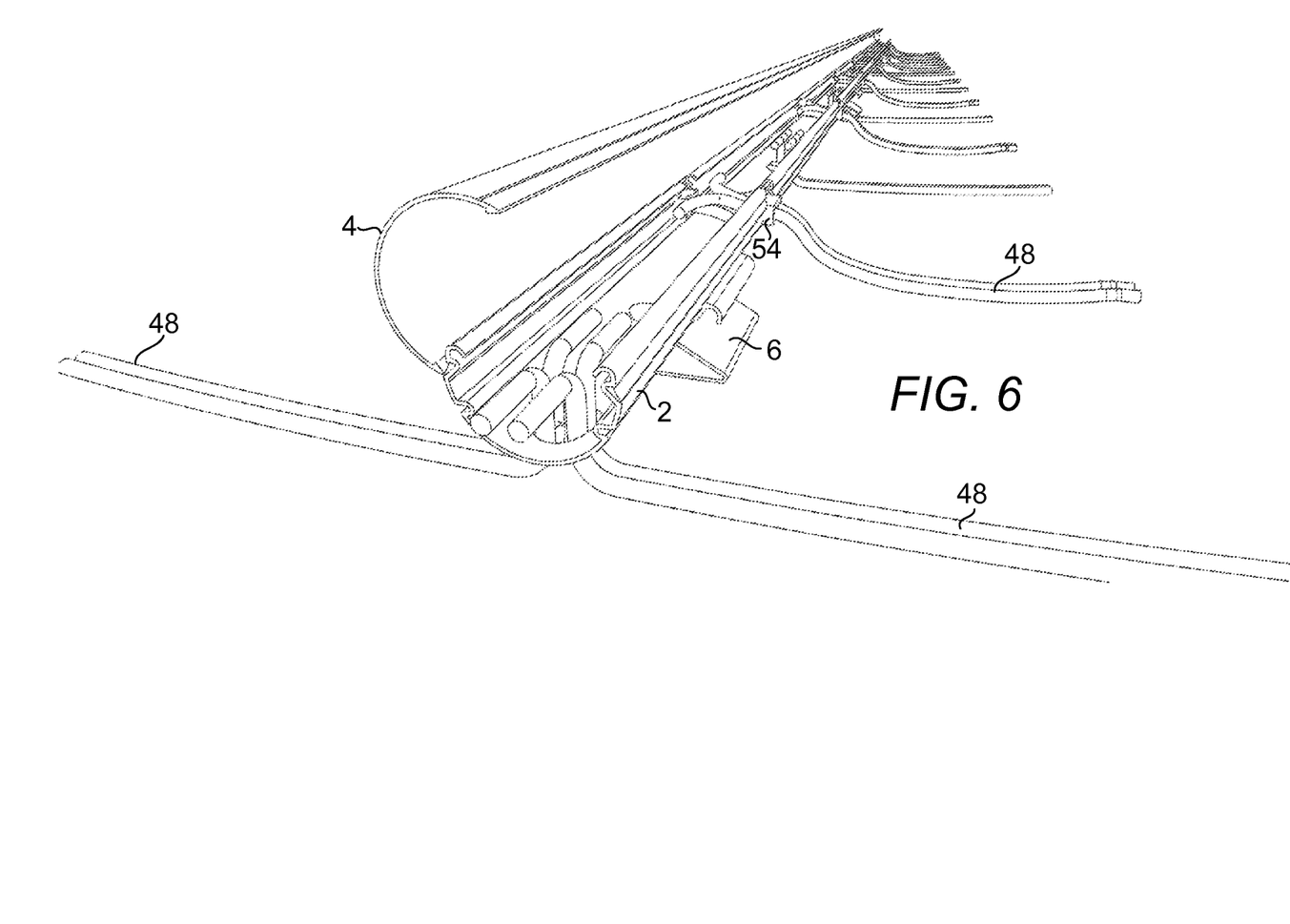
FIG. 6 is a perspective view of a cable protector in its semi-assembled state, in accordance with one embodiment of the present invention, depicting some installed cables.

FIG. 6 is a perspective view of a cable protector in its semi-assembled state, in accordance with one embodiment of the present invention, depicting some installed cables 48. Referring back to FIG. 1, one or more apertures 52 can be obtained by penetrating one or more knockouts 18 disposed on a bottom channel 2. Such apertures 52 allow cable entry into or exit from the interior space or cavity of conduit 3. A knockout is essentially a panel in the bottom channel, so designed that it can readily be removed, as by punching, hammering, or cutting, to provide an opening into the interior space of the conduit. In this instance, if a knockout 18 is removed, an aperture 52 is formed to allow cable entry or exit. During field installations, an installer can determine whether or not to pry a knockout 18 out to create an aperture 52 through which cables 48 can be inserted in the cavity of a conduit 3 created by the top and bottom channels 4, 2. Cables 48 may be inserted in the cavity via one or more apertures 52 disposed at the bottom or a side wall or the bottom channel 2. Grommets 54 are used wherever necessary to reduce the size of openings created by apertures to prevent intrusions of foreign matter into the conduit 3 cavity.

Figure 7:
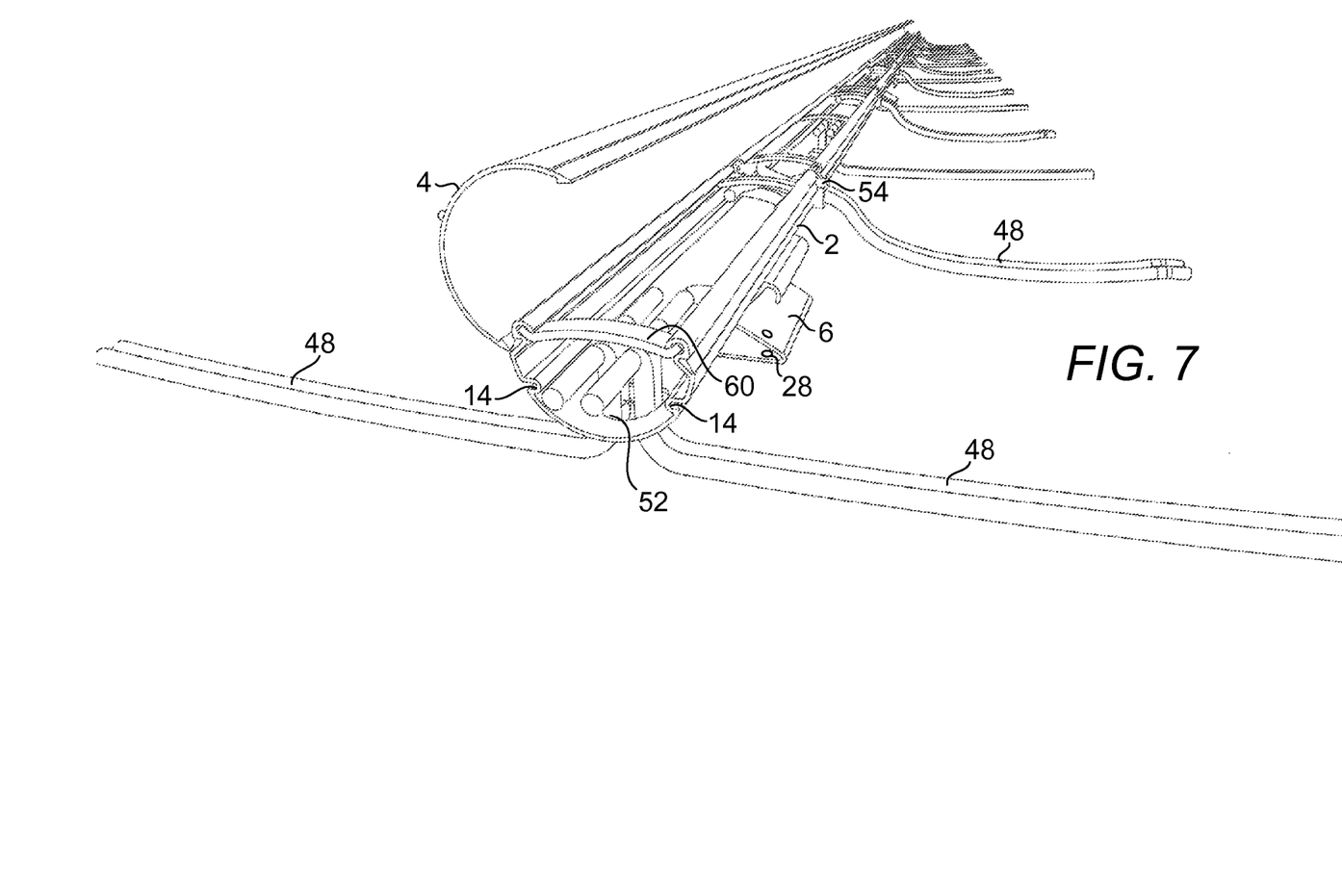
FIG. 7 is a perspective view of a cable protector in its semi-assembled state, in accordance with one embodiment of the present invention, depicting some installed cables and cable retainer straps with an uninstalled conduit.
Figure 8:
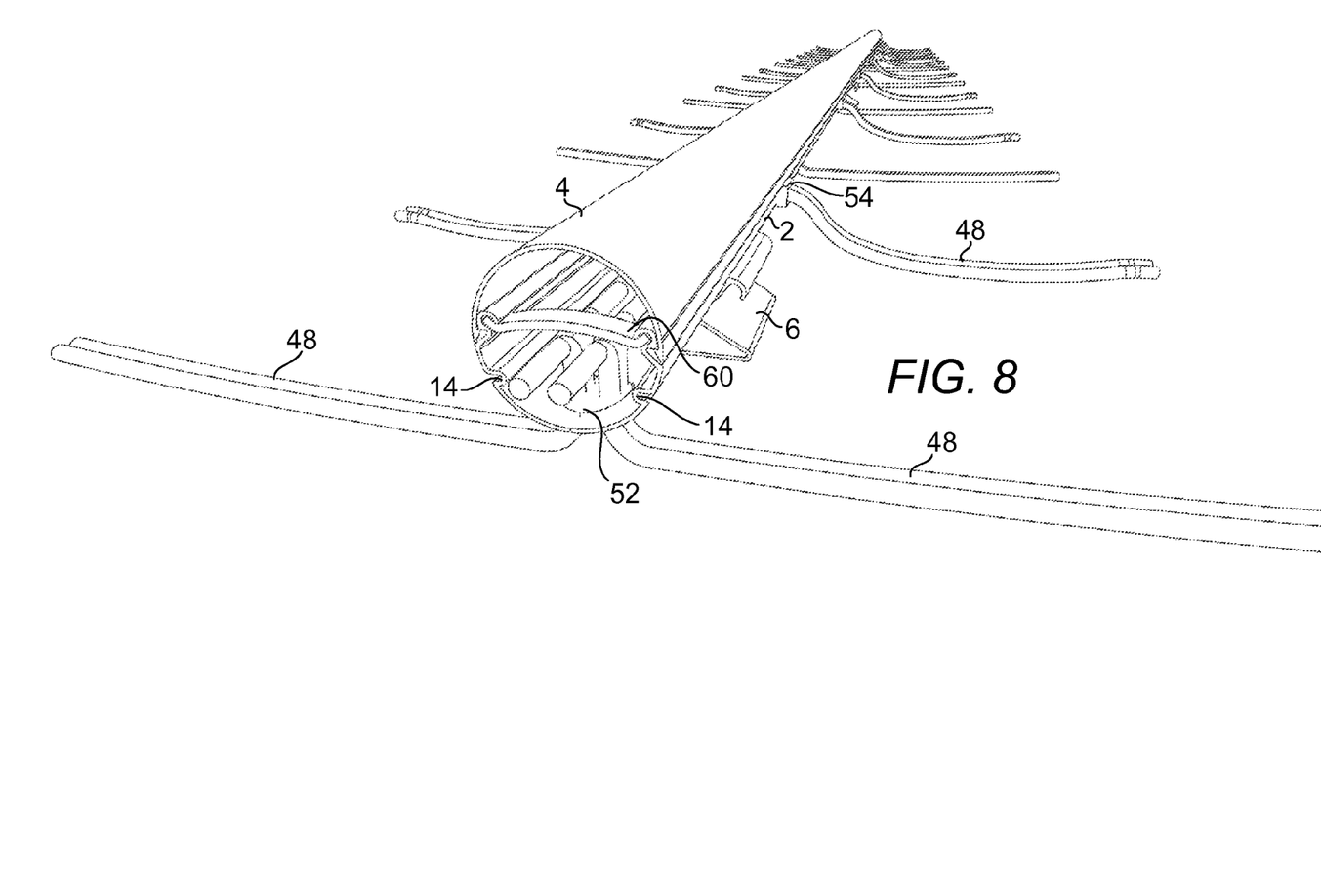
FIG. 8 is a perspective view of a cable protector in its semi-assembled state, in accordance with one embodiment of the present invention, depicting some installed cables and cable retainer straps with an installed conduit.

In one embodiment, the bottom channel 2 further includes at least one holder 42 disposed substantially at the at least one engaging edge of the bottom channel 2. FIG. 7 is a perspective view of a cable protector in its semi-assembled state, in accordance with one embodiment of the present invention, depicting some installed cables 48 and cable retainer straps 60 and an uninstalled conduit. FIG. 8 is essentially a view similar to that of FIG. 7, with the exception that the conduit is shown installed. A holder 42 extending the entire length of the conduit, is adapted to removably receive one end of a strap 60 configured to prevent intrusion of the cables outside of the opening defined by the bottom channel 2, e.g., in the space covered by the top channel 4. In the embodiment shown, there are two holders 42, each substantially disposed on one engaging edge of the bottom channel 2. In installing a retainer strap 60, its ends are simply aligned with the holders 42 such that the retainer strap 60 can be adjustably held along the length of a conduit. In one embodiment, the supporting base 6 further includes at least one aperture 28 configured to facilitate fastening of the supporting base 6 to a structure.

Figure 9:
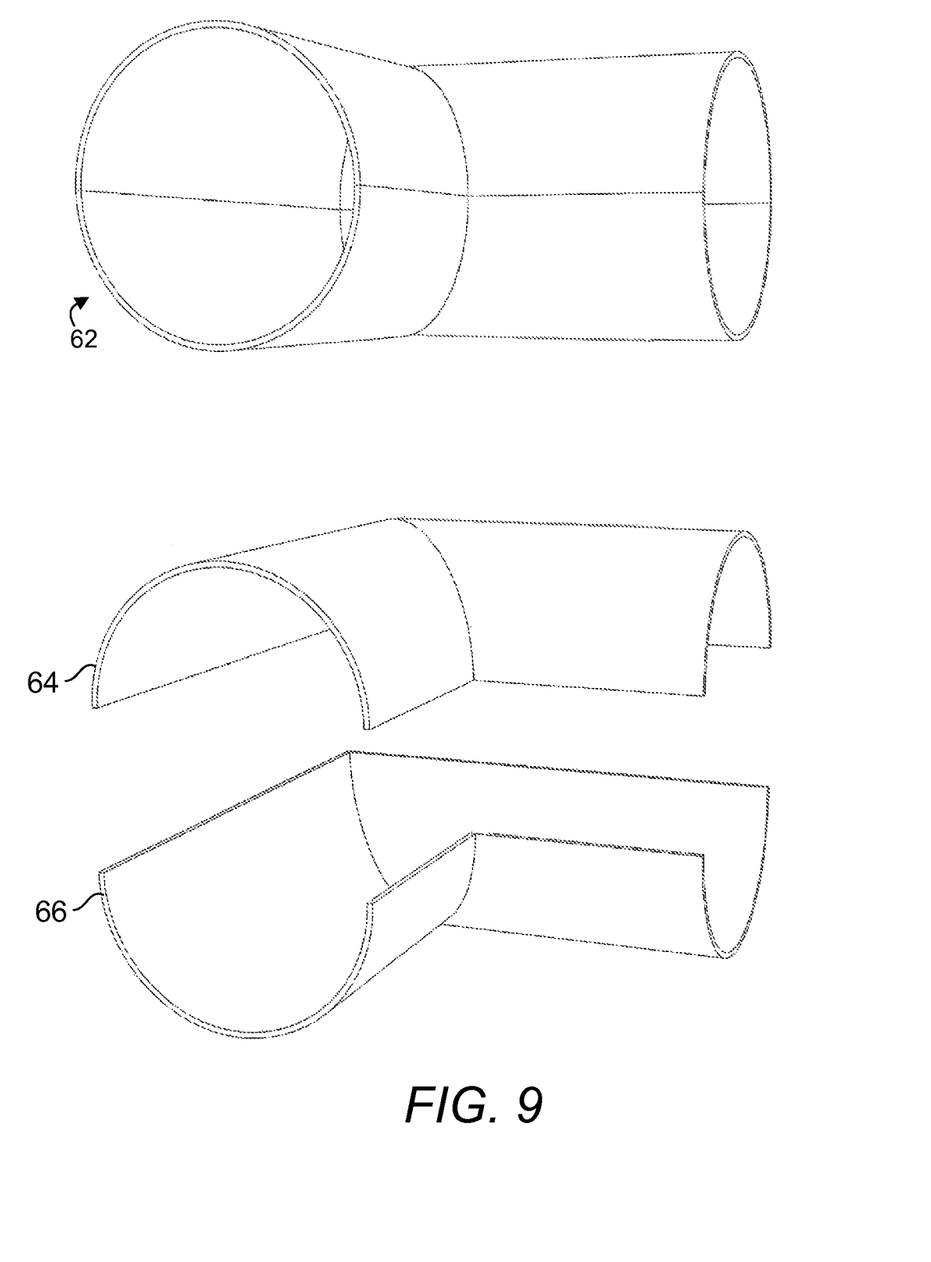
FIG. 9 depicts views of an elbow fitting, in accordance with one embodiment of the present invention.
Figure 10:
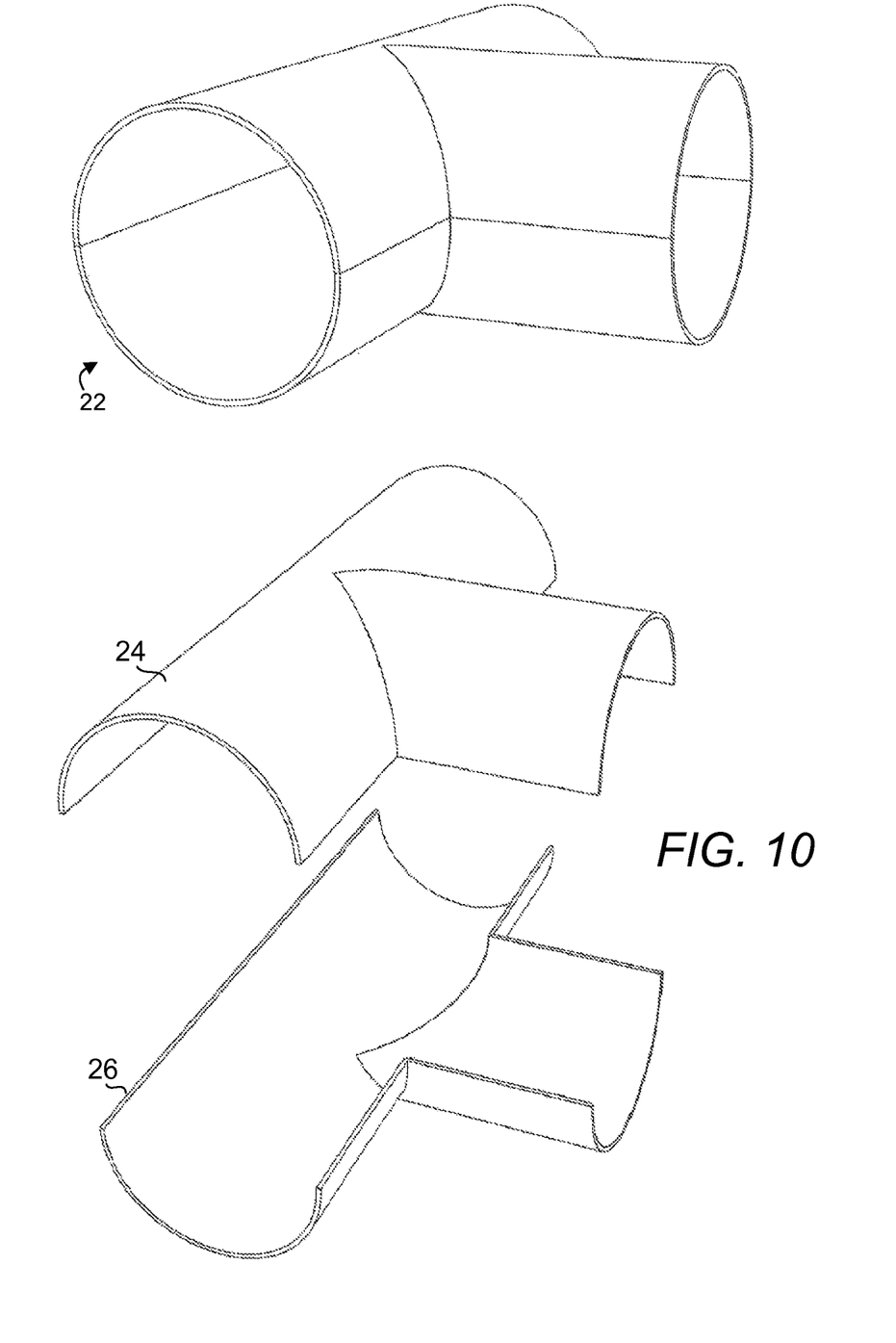
FIG. 10 depicts views of a tee fitting, in accordance with one embodiment of the present invention.

FIG. 9 depicts views of an elbow fitting 62, in accordance with one embodiment of the present invention. FIG. 10 depicts views of a tee fitting 22, in accordance with one embodiment of the present invention. FIG. 9 shows a 90-degree elbow fitting made to especially for the conduit 3 that allows routing of cables around bends. The two portions 64, 66 of an elbow fitting 62 or parts 24, 26 of a tee fitting 22 separate in much the same manner as described for the top channel 4 and bottom channel 2 without the engaging edges. In one embodiment, one or more fasteners are used to secure a fitting 62, 22 to a conduit at one or more locations along line 20. Elbows of other degrees of bend are also possible. Many other fittings known in the plumbing industry will be useful such as elbows of varying angles such as 45 degrees, 22.5 degrees, wye fittings, manifolds, or reducing bushings. These would function the same way as described for the straight sections in order to allow unlimited possibilities to route the conduit anywhere it has to go. As each fitting or conduit is an assembly of two portions, replacement of a previously installed fitting or conduit does not require complete removal of the already installed cables as a bottom portion of a fitting or a bottom channel can simply be slid underneath previously installed cables before a top channel or top portion is used to complete the replacement.

Figure 11:
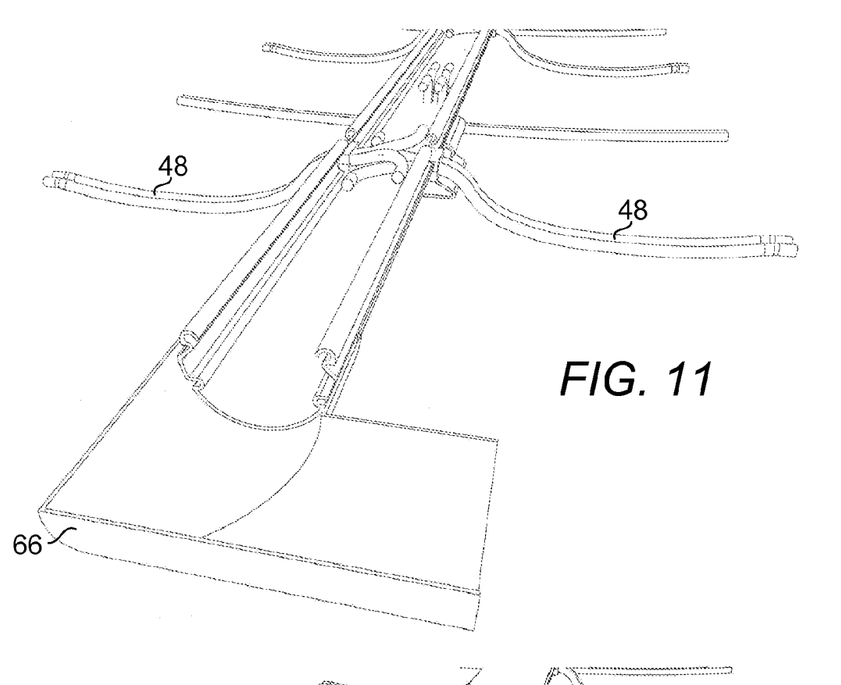
FIG. 11 is a partial perspective view of a cable protector in accordance with one embodiment of the present invention, depicting an installed bottom portion of an elbow fitting.
Figure 12:
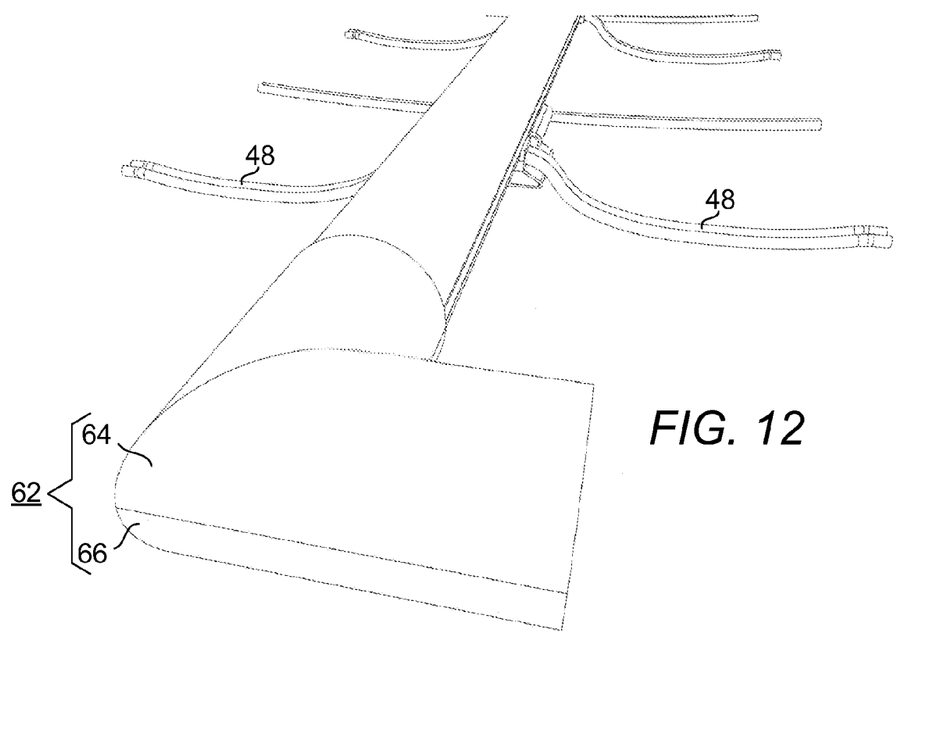
FIG. 12 is a partial perspective view of a cable protector in accordance with one embodiment of the present invention, depicting an installed elbow fitting.
Figure 13:
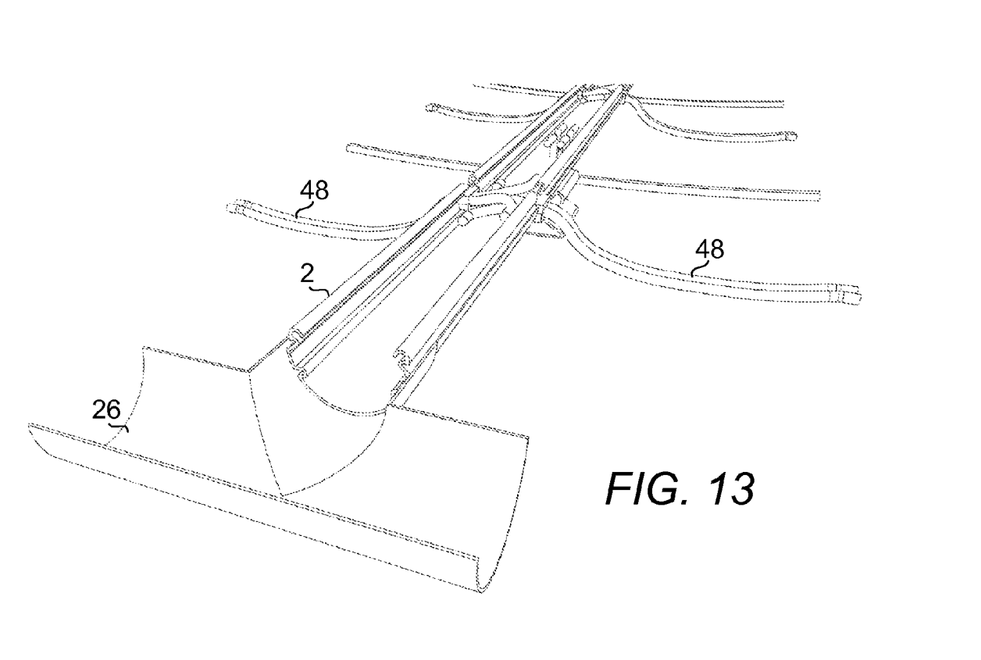
FIG. 13 is a partial perspective view of a cable protector in accordance with one embodiment of the present invention, depicting an installed bottom portion of a tee fitting.
Figure 14:
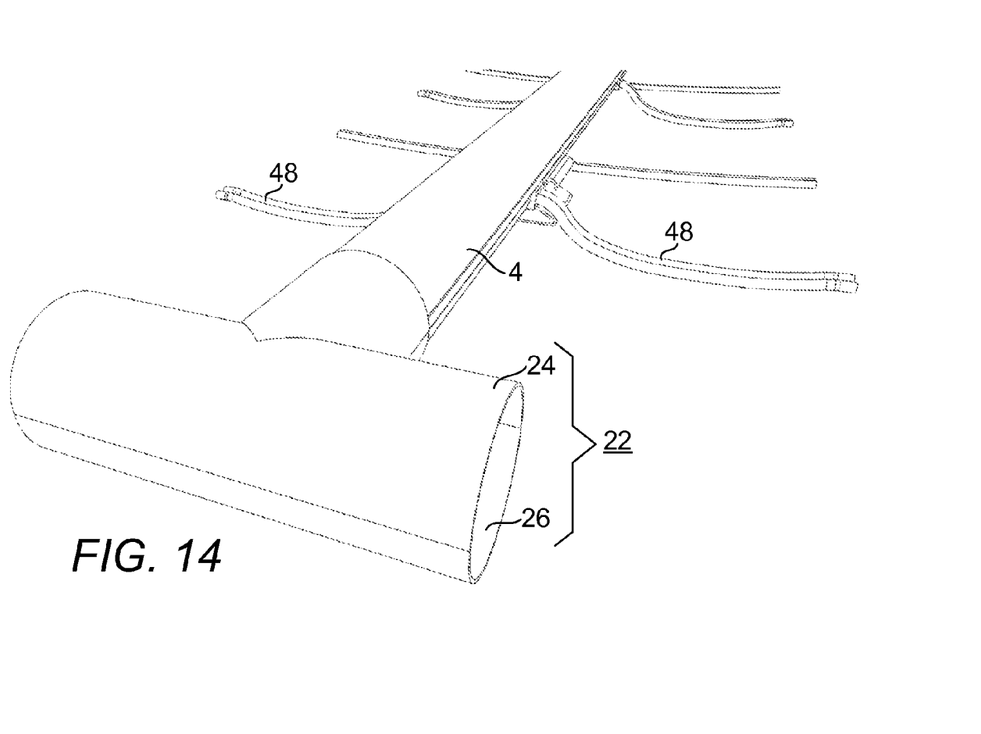
FIG. 14 is a partial perspective view of a cable protector in accordance with one embodiment of the present invention, depicting an installed tee fitting.

FIG. 11 is a partial perspective view of a cable protector in accordance with one embodiment of the present invention, depicting an installed bottom portion 66 of an elbow fitting 62. FIG. 12 is a partial perspective view of a cable protector in accordance with one embodiment of the present invention, depicting an installed elbow fitting 62. FIG. 13 is a partial perspective view of a cable protector in accordance with one embodiment of the present invention, depicting an installed bottom portion 26 of a tee fitting 22. FIG. 14 is a partial perspective view of a cable protector in accordance with one embodiment of the present invention, depicting an installed tee fitting 22.

During installation, a supporting base 6 is first located on a mounting surface such as a rooftop. The considerable surface area and grooved surface of bottom face of a supporting base 6 allows for mounting to surfaces such as rooftops using adhesives or pressure sensitive tape. This is an important advantage over conventional screw-mounted troughs when mounting on impermeable membranes that must not be breached by screws. This is possible for the present cable protector because the rounded or cylindrical aerodynamic shape of the conduit that is formed by the conduit 3 which results in lower wind forces than rectangular shaped cable protectors. In other embodiments where there are no concerns of breaching the integrity of a rooftop membrane, the present cable protector may be modified to incorporate flanges that allow screw mounting for those applications where the use of screws might be preferred.

At this point, the installer would typically prepare the bottom channel 2 to accept incoming cables if necessary by removing the knockouts 18. The apertures 52 resulting from removing knockouts can then be equipped with conventional waterproof cord grips or grommets 54. Referring back to FIG. 2, it can be seen that the knockouts 18 are located on the bottom of the bottom channel 2 as a further protection against ingress of moisture, and also to protect from damaging UV radiation. An optional enhancement to help organize the cables within the conduit 3 is to mold a plurality of partitions running lengthwise along the bottom channel 2.

The next step to install the present cable protector is to snap the bottom channel 2 into place by engaging the projecting bosses 30 into grooves 14 of the bottom channel 2. The thickness of the engaging portions of the bottom channel 2 and the supporting base 6 is configured to allow just enough flexing so the parts can be deformed by hand pressure to easily allow this engagement, but prevent accidental disengagement. In practice, sheet metal with a thickness of about 0.062 inch thickness is a suitable base material from which cable protectors are constructed as it provides sufficient physical support for cables in about 20-foot sections, while allowing sufficient flexion to permit the aforementioned engagement. The assembled conduit 3 is shown in FIG. 4. Although easy to snap into place, the top channel 4 is sufficiently secured so that it is impossible to remove it casually, or by wind, or by tripping over it, dropping objects, etc. The top channel 4 can be removed quite easily by first inserting a screwdriver in a seam resulting from an installed top channel 4 on a bottom channel 2 and subsequently prying. The prying action disengages one side of the top channel 4. Once a small section of the length is pried open, the opening "travels" along the remainder of the conduit length, causing the top and bottom channels to easily separate.

In one embodiment, the diameter or height 58 of a present conduit ranges from about 2 inches to about 3.5 inches while the supporting base elevates the conduit from about 1 inch to about 3 inches due to its height 56. Conduits may also be fabricated by extrusion or another process in lengths suitable for customary construction practices, e.g., 8 ft, 12 ft and 20 ft etc.

The forgoing describes the preferred embodiment. Suitable materials for constructing the present channels and supporting base, include, but not limited to, aluminum, steel, Polyvinyl Chloride (PVC) and Acrylonitrile Butadiene Styrene (ABS). PVC and ABS offer some certain advantages as they are light-weight and resistant against Ultra-Violet (UV) radiation. Alternate dimensions may be desirable for managing different cable quantities and diameters. Enhancements such as bendable sections, extensible sections, multi-outlet sections such a crosses are possible. Various cable organizing additions such as multiple partitions, nesting conduits are also possible and within the scope of this disclosure.

The detailed description refers to the accompanying drawings that show, by way of illustration, specific aspects and embodiments in which the present disclosed embodiments may be practiced. These embodiments are described in sufficient detail to enable those skilled in the art to practice aspects of the present invention. Other embodiments may be utilized, and changes may be made without departing from the scope of the disclosed embodiments. The various embodiments can be combined with one or more other embodiments to form new embodiments. The detailed description is, therefore, not to be taken in a limiting sense, and the scope of the present invention is defined only by the appended claims, with the full scope of equivalents to which they may be entitled. It will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present disclosed embodiments includes any other applications in which embodiments of the above structures and fabrication methods are used. The scope of the embodiments should be determined with reference to the appended claims, along with the full scope of equivalents to which such claims are entitled.

What is claimed herein is:

1. A cable protector for enclosing cables, said cable protector comprising a conduit comprising:

(a) a top channel (4) having at least one engaging edge;
    (b) a bottom channel (2) having at least one engaging edge adapted to be removably coupled to said at least one engaging edge of said top channel, wherein said pair of removably coupled engaging edges comprises an outer portion having a profile comprising a projection (34) extending from a step (38) to a tip having a cam surface (36) and an inner portion having a profile comprising a locking step (40) and a cam surface (44) and said outer portion is configured such that when urged against said inner portion, said outer portion is slidingly coupled to said inner portion at their cam surfaces (36), (44) until said step (38) becomes locked in said locking step (40) to form a cavity within said conduit to accommodate the cables and when pulled from said inner portion, said outer portion is slidingly decoupled from said inner portion after said step (38) becomes dislodged from said locking step (40) to provide access to the cables disposed within the cavity; and
    (c) a sealing material configured to be disposed between said pair of removably coupled engaging edges configured for removable coupling to provide enhanced sealing between said top and bottom channels (4),(2).

2. The cable protector of claim 1, further comprising a supporting base (6) configured for removable attachment to said bottom channel (2) to support said conduit.

3. The cable protector of claim 2, wherein said bottom channel (2) further comprises a pair of engagement features adapted for removable engagement with a pair of engagement features of said supporting base.

4. The cable protector of claim 3, wherein at least one of said pair of engagement features of said bottom channel and said pair of engagement features of said supporting base comprises a boss (30) adapted to be removably engaged with a groove (14).

5. The cable protector of claim 2, further comprising an adhesive adapted to a bottom face of said supporting base (6) to secure said supporting base (6) to a structure.

6. The cable protector of claim 2, wherein said supporting base (6) further comprises at least one aperture configured to receive a fastener for fastening of said supporting base (6) to a structure.

7. The cable protector of claim 1, wherein outer surfaces of said engaging edges configured for removable coupling are substantially featureless to lower wind drag.

8. The cable protector of claim 1, wherein said bottom channel (2) further comprises at least one aperture for enabling access to said cavity.

9. The cable protector of claim 1, wherein the cross-sectional profile of said conduit is circular.

10. The cable protector of claim 1, wherein each said channel is constructed from a material selected from the group consisting of aluminum, steel, Polyvinyl Chloride (PVC) and Acrylonitrile Butadiene Styrene (ABS).

11. The cable protector of claim 1, wherein said bottom channel (2) further comprises at least one holder (42) disposed substantially at said at least one engaging edge of said bottom channel (2), wherein said at least one holder (42) is adapted to removably receive one end of a strap (60) configured to prevent intrusion of the cables outside of the opening defined by said bottom channel (2).

12. The cable protector of claim 1, further comprising an elbow fitting having a top portion (64) and a bottom portion (66), wherein said elbow fitting is adapted to one end of said conduit.

13. The cable protector of claim 1, further comprising a tee fitting having a top portion (24) and a bottom portion (26), wherein said tee fitting is adapted to one end of said conduit.

* * * * *